(12) United States Patent
Matsumoto

(10) Patent No.: US 11,855,112 B2
(45) Date of Patent: Dec. 26, 2023

(54) SENSOR CHIP AND ELECTRONIC APPARATUS

(71) Applicant: SONY SEMICONDUCTOR SOLUTIONS CORPORATION, Kanagawa (JP)

(72) Inventor: Akira Matsumoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 40 days.

(21) Appl. No.: 17/462,223

(22) Filed: Aug. 31, 2021

(65) Prior Publication Data

US 2021/0399039 A1 Dec. 23, 2021

Related U.S. Application Data

(63) Continuation of application No. 16/487,453, filed as application No. PCT/JP2018/009909 on Mar. 14, 2018, now Pat. No. 11,127,772.

(30) Foreign Application Priority Data

Mar. 24, 2017 (JP) ................................. 2017-059100

(51) Int. Cl.
*H01L 27/146* (2006.01)

(52) U.S. Cl.
CPC .... *H01L 27/14627* (2013.01); *H01L 27/1464* (2013.01); *H01L 27/14629* (2013.01);
(Continued)

(58) Field of Classification Search
CPC ........... H01L 27/14627; H01L 27/1464; H01L 27/14629; H01L 27/14623; H01L 27/1463;
(Continued)

(56) References Cited

U.S. PATENT DOCUMENTS 5,521,743 A 5/1996 Holmes et al.
8,836,066 B1 9/2014 Brown et al.
(Continued)

FOREIGN PATENT DOCUMENTS

CN 1956203 A 5/2007
CN 106257678 A 12/2016
(Continued)

OTHER PUBLICATIONS

Office Action for JP Patent Application No. 2019-507588, dated Sep. 28, 2021, 04 pages of English Translation and 04 pages of Office Action.
(Continued)

*Primary Examiner* — Galina G Yushina
(74) *Attorney, Agent, or Firm* — CHIP LAW GROUP

(57) ABSTRACT

The present disclosure relates to a sensor chip and an electronic apparatus each of which enables carriers generated through photoelectric conversion to be efficiently used. At least one or more avalanche multiplication regions multiplying carriers generated through photoelectric conversion are provided in each of a plurality of pixel regions in a semiconductor substrate, and light incident on the semiconductor substrate is condensed by an on-chip lens. Then, a plurality of on-chip lenses is arranged in one pixel region. The present technology, for example, can be applied to a back-illuminated type CMOS image sensor.

20 Claims, 12 Drawing Sheets

(52) U.S. Cl.
CPC .... *H01L 27/1463* (2013.01); *H01L 27/14621* (2013.01); *H01L 27/14623* (2013.01); *H01L 27/14645* (2013.01)

(58) Field of Classification Search
CPC ......... H01L 27/14621; H01L 27/14645; H01L 27/14649
See application file for complete search history.

(56) References Cited

U.S. PATENT DOCUMENTS

| | | |
|---|---|---|
| 9,209,320 B1 | 12/2015 | Webster |
| 2003/0136981 A1 | 7/2003 | Sugiyama |
| 2005/0161584 A1 | 7/2005 | Tanaka |
| 2008/0135963 A1 | 6/2008 | Akiyama |
| 2010/0177223 A1* | 7/2010 | Rennie ............... H01L 31/107 257/438 |
| 2010/0182471 A1 | 7/2010 | Toda |
| 2010/0187501 A1 | 7/2010 | Toda |
| 2011/0079765 A1 | 4/2011 | Soma et al. |
| 2011/0242376 A1 | 10/2011 | Ando |
| 2014/0131779 A1 | 5/2014 | Takeda |
| 2014/0218572 A1* | 8/2014 | Ootsuka ............ H01L 27/14685 438/70 |
| 2015/0064629 A1* | 3/2015 | Wu ..................... G03F 7/0005 430/321 |
| 2015/0069564 A1 | 3/2015 | Hatano |
| 2015/0162373 A1 | 6/2015 | Kim et al. |
| 2015/0189200 A1 | 7/2015 | Jin et al. |
| 2016/0014362 A1* | 1/2016 | Kurokawa ............ G01S 17/89 348/297 |

FOREIGN PATENT DOCUMENTS

| | | |
|---|---|---|
| EP | 2306523 A2 | 4/2011 |
| JP | 2003-218332 A | 7/2003 |
| JP | 2010-177392 A | 8/2010 |
| JP | 2010177705 A | 8/2010 |
| JP | 2011-077467 A | 4/2011 |
| JP | 2011-146635 A | 7/2011 |
| JP | 2013-143431 A | 7/2013 |
| JP | 2014-096490 A | 5/2014 |
| JP | 2014086514 A | 5/2014 |
| JP | 2015-167219 A | 9/2015 |
| JP | 2016062996 A | 4/2016 |
| JP | 2016-082067 A | 5/2016 |
| WO | WO-2008136634 A1 | 11/2008 |
| WO | 2015/122300 A1 | 8/2015 |

OTHER PUBLICATIONS

International Search Report and Written Opinion of PCT Application No. PCT/JP2018/009909, dated May 22, 2018, 10 pages of English Translation and 08 pages of ISRWO.
Non-Final Office Action for U.S. Appl. No. 16/487,453, dated Nov. 17, 2020, 20 pages.
Final Office Action for U.S. Appl. No. 16/487,453, dated Mar. 19, 2021, 12 pages.
Notice of Allowance for U.S. Appl. No. 16/487,453, dated Aug. 25, 2021, 05 pages.
Notice of Allowance for U.S. Appl. No. 16/487,453, dated May 27, 2021, 10 pages.
International Preliminary Report on Patentability of PCT Application No. PCT/JP2018/009909, dated Oct. 3, 2019, 10 pages of English Translation and 05 pages of IPRP.

* cited by examiner

SENSOR CHIP AND ELECTRONIC APPARATUS

CROSS REFERENCE TO RELATED APPLICATIONS

This application is a continuation application of U.S. patent application Ser. No. 16/487,453 filed on Aug. 21, 2019, which is a U.S. National Phase of International Patent Application No. PCT/JP2018/009909 filed on Mar. 14, 2018, which claims priority benefit of Japanese Patent Application No. JP 2017-059100 filed in the Japan Patent Office on Mar. 24, 2017. Each of the above-referenced applications is hereby incorporated herein by reference in its entirety.

TECHNICAL FIELD

The present disclosure relates to a sensor chip and an electronic apparatus, and more particularly to a sensor chip and an electronic apparatus each of which enables carriers generated through photoelectric conversion to be efficiently used.

BACKGROUND ART

In recent years, in a CMOS (Complementary Metal Oxide Semiconductor) image sensor, a distance image sensor which performs distance measurement by using a ToF (Time-of-Flight) method, and the like, an SPAD (Single Photon Avalanche Diode), an APD (Avalanche Photodiode) or the like which can enhance a light receiving sensitivity (detection efficiency) by utilizing a phenomenon called avalanche multiplication has been utilized. In addition, for the purpose of further promoting the enhancement of the light receiving sensitivity, it has been proposed to form an on-chip lens for each SPAD or APD.

For example, PTL 1 discloses a quantum dot sensor which is capable of enhancing the light receiving sensitivity by avalanche amplification, and which has a configuration in which one on-chip lens is arranged for one pixel.

CITATION LIST

Patent Literature

[PTL 1]
Japanese Patent Laid-Open No. 2010-177392

SUMMARY

Technical Problem

However, in the configuration disclosed in PTL 1 described above, for example, along with an increase in pixel size, it becomes difficult to form an on-chip lens having a large curvature, and it is thus difficult to concentrate light. For this reason, in some cases, it is impossible to efficiently collect the carriers generated through the photoelectric conversion in a multiplication region of the SPAD, the APD, or the like, resulting in that the light receiving sensitivity is reduced. In particular, as for infrared light having a low absorption efficiency in silicon, a semiconductor substrate is required to have a certain thickness for a photoelectric conversion region. Thus, since the photoelectric conversion is performed at a portion located away from the multiplication region of the SPAD, the APD, or the like, it is difficult to efficiently use the carriers generated through the photoelectric conversion.

The present disclosure has been made in the light of such a situation, and enables carriers generated through photoelectric conversion to be efficiently used.

Solution to Problem

A sensor chip according to one aspect of the present disclosure includes a semiconductor substrate in which at least one or more avalanche multiplication regions multiplying carriers generated through photoelectric conversion are provided in each of a plurality of pixel regions, and an on-chip lens condensing light incident on the semiconductor substrate. A plurality of the on-chip lenses is arranged in one of the pixel regions.

An electronic apparatus according to one aspect of the present disclosure includes a sensor chip, the sensor chip including a semiconductor substrate in which at least one or more avalanche multiplication regions multiplying carriers generated through photoelectric conversion are provided in each of a plurality of pixel regions, and an on-chip lens condensing light incident on the semiconductor substrate. A plurality of the on-chip lenses being arranged in one of the pixel regions.

In one aspect of the present disclosure, at least one or more avalanche multiplication regions multiplying carriers generated through photoelectric conversion are provided in each of a plurality of pixel regions in a semiconductor substrate, and light incident on the semiconductor substrate is condensed by an on-chip lens. A plurality of the on-chip lenses is arranged in one of the pixel regions.

Advantageous Effect of Invention

According to one aspect of the present disclosure, carriers generated through photoelectric conversion can be efficiently used.

DESCRIPTION OF EMBODIMENTS

Hereinafter, specific embodiments to each of which the present technology is applied will be described in detail with reference to the drawings.

<First Configuration Example of APD Sensor>

Figure 1A:
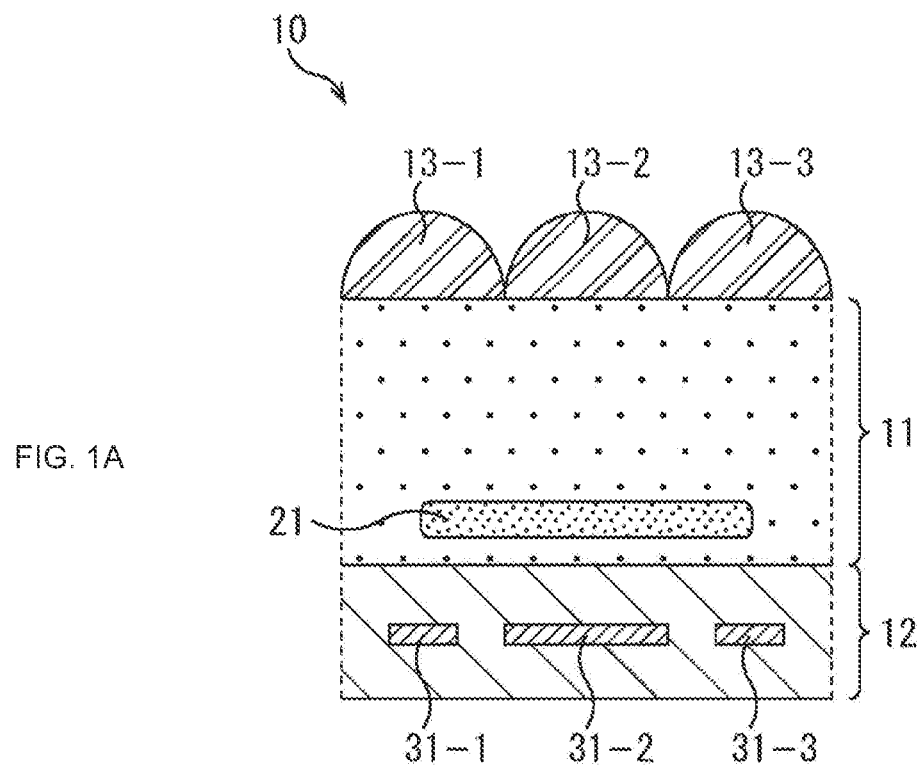
FIGS. 1A and 1B are views depicting a configuration example of an APD sensor according to a first embodiment to which the present technology is applied.
Figure 1B:
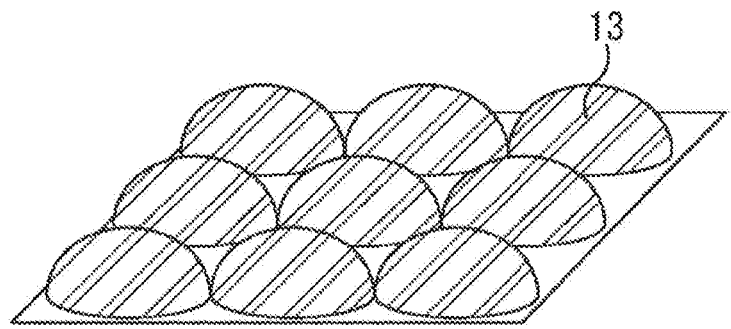

FIGS. 1A and 1B are views depicting a configuration example of an APD sensor according to a first embodiment to which the present technology is applied.

FIG. 1A depicts a cross-sectional configuration in one pixel region of an APD sensor 10, and FIG. 1B depicts a perspective view when viewed from a light illumination surface at which the APD sensor 10 is illuminated with light.

As depicted in the figure, the APD sensor 10 is of a back-illuminated type in which a back surface (a surface facing upward in FIGS. 1A and 1B) of a semiconductor substrate 11 is illuminated with light. The APD sensor 10 is configured in such a way that a wiring layer 12 is laminated on a front surface side of the semiconductor substrate 11, and a plurality of on-chip lenses 13 is laminated on the back surface side of the semiconductor substrate 11.

The semiconductor substrate 11, for example, is a wafer obtained by slicing a single crystal silicon into a thin piece. An N-type or P-type impurity is ion-implanted into the semiconductor substrate 11, thereby forming an N-type diffusion layer or a P-type diffusion layer, and photoelectric conversion is performed through PN junction between the N-type diffusion layer and the P-type diffusion layer. It should be noted that as the semiconductor substrate 11, in addition to silicon, a material suitable for detection of infrared light may be used. For example, a compound semiconductor such as GaAs (Gallium Arsenide), InGaAs (Indium Gallium Arsenide), or CIGS (Cu, In, Ga, Se) may also be used. By using such a material, the APD sensor 10 can be utilized as an infrared sensor.

In addition, in the vicinity of the wiring layer 12 inside the semiconductor substrate 11, one avalanche multiplication region 21 is provided in one pixel region of the APD sensor 10. The avalanche multiplication region 21, for example, is a high electric field region formed in a boundary surface between the P-type diffusion layer and the N-type diffusion layer by a large negative voltage applied to the P-type diffusion layer. The avalanche multiplication region 21 can multiply carriers (e−) generated through the photoelectric conversion of the light incident on the semiconductor substrate 11.

The wiring layer 12, for example, is configured by forming a plurality of metal wirings 31 in an insulating film, and these metal wirings 31 are arranged at positions corresponding to (overlapping when viewed in plan) the plurality of on-chip lenses 13, respectively. In addition, the metal wirings 31 each have a function as a reflection film which reflects the light having passed through the semiconductor substrate 11.

In the example depicted in FIGS. 1A and 1B, three metal wirings 31-1 to 31-3 are provided in the wiring layer 12. Then, the metal wiring 31-1 is arranged so as to correspond to the on-chip lens 13-1, the metal wiring 31-2 is arranged so as to correspond to the on-chip lens 13-2, and the metal wiring 31-3 is arranged so as to correspond to the on-chip lens 13-3. In addition, the metal wiring 31-2 arranged at the center of the one pixel region of the APD sensor 10 is preferably formed so as to have a wider area than those of the other metal wirings 31-1 and 31-2.

The plurality of on-chip lenses 13 is arranged on a side of the light illumination surface at which the semiconductor substrate 11 is illuminated with light, and each on-chip lens 13 condenses light incident on the semiconductor substrate 11. Then, in the APD sensor 10, the plurality of on-chip lenses 13 is arranged in one pixel region. In addition, these on-chip lenses 13 are preferably arranged in such a way that when the APD sensor 10 is viewed in plan, the number of on-chip lenses 13 arranged in a longitudinal direction and the number of on-chip lenses 13 arranged in a transverse direction are equal to each other (the arrangement forms a square).

For example, as depicted in FIG. 1B, it is preferable that for one pixel region of the APD sensor 10, nine on-chip lenses 13 are arranged in such a way that the longitudinal direction×the transverse direction is 3×3 when the APD sensor 10 is viewed in plan. That is, when the APD sensor 10 is viewed in plan, the avalanche multiplication region 21 is arranged at a central portion of the one pixel region of the APD sensor 10. As depicted in the figure, the 3×3 on-chip lenses 13 are arranged, resulting in that the light can be condensed toward the central portion of the one pixel region of the APD sensor 10 and, at the same time, light on an end portion side can be made to get close to the central position side. In addition, these on-chip lenses 13 are formed so as to have a uniform size.

In such a manner, the plurality of on-chip lenses 13 is suitably arranged in such a way that the light can be efficiently condensed toward the central position at which the avalanche multiplication region 21 is disposed, so that the photoelectric conversion can be easily performed in the vicinity of the avalanche multiplication region 21. As a result, the carriers generated through the photoelectric conversion become easy to flow into the avalanche multiplication region 21, and thus the number of carriers multiplied in the avalanche multiplication region 21 can be increased. Therefore, the carriers generated through the photoelectric conversion can be efficiently used and, as a result, the light receiving sensitivity (the detection efficiency) can be further enhanced.

That is, heretofore, although the carriers obtained through the photoelectric conversion in a depletion layer region located above the avalanche multiplication region diffuse to reach the avalanche multiplication region to contribute to the avalanche multiplication, the carriers obtained through the photoelectric conversion in other regions flow out to an anode or a cathode without going through the avalanche multiplication region. On the other hand, in the case of the APD sensor 10, the plurality of on-chip lenses 13 is arranged such that the photoelectric conversion can be performed in the vicinity of the avalanche multiplication region 21. Therefore, it is possible to avoid a situation where the carriers generated through the photoelectric conversion flow out to the anode or the cathode without going through the avalanche multiplication region.

In addition, in the APD sensor 10 configured as described above, the plurality of on-chip lenses 13 is provided for one pixel region of the APD sensor 10, thereby enabling the size of each of the on-chip lenses 13 to be reduced. Therefore, as compared with a configuration in which one on-chip lens is provided for one pixel region, for example, the on-chip lenses 13 can be formed in the APD sensor 10 in such a way that the curvature becomes large (the radius curvature becomes small). As a result, in the APD sensor 10, the light can be efficiently concentrated on the avalanche multiplication region 21 by the on-chip lenses 13 having the large curvature, and thus the enhancement of the detection efficiency can be promoted.

In addition, since in the APD sensor 10, the light is condensed by the on-chip lenses 13, an optical path inside the semiconductor substrate 11 can be lengthened all the more as compared with a configuration in which no on-chip lens is provided. As a result, even if a thinner semiconductor substrate 11 is used, it is hard for the light to pass through the thinner semiconductor substrate 11 all the more because the light is condensed by the on-chip lenses 13. Therefore, it is possible to avoid the reduction of the detection efficiency. That is, even with the detection efficiency substantially equal to that in the configuration in which one on-chip lens is provided for one pixel region, the semiconductor substrate 11 can be thinned.

In such a way, the APD sensor 10 in which a thin semiconductor substrate 11 is used can suppress timing jitter, and the bad influence of the timing jitter can be avoided. That is, in an APD sensor in which a thick semiconductor substrate is used, a distance along which the carriers move from a portion at which the light made incident on the semiconductor substrate is photoelectrically converted to the avalanche multiplication region is long, so that the timing jitter is increased.

In contrast, thinning the semiconductor substrate 11 results in that the distance along which the carriers move from the portion at which the light made incident on the semiconductor substrate 11 is photoelectrically converted to the avalanche multiplication region 21 can be shortened, and thus the timing jitter can be suppressed. Therefore, for example, in the case where the APD sensor 10 is utilized as the distance image sensor, the distance can be measured more accurately.

Further, even if the APD sensor 10 adopts a configuration in which one pixel region is increased in size in order to increase an amount of signal, the provision of a plurality of on-chip lenses 13 results in that the on-chip lenses 13 having a sufficient curvature corresponding to the size of the pixel can be formed, and thus a region with a high light intensity can be locally aimed (produced). As a result, it is possible to enhance the freedom of the design when the avalanche multiplication region 21 is designed.

In addition, the APD sensor 10 is of the back-illuminated type as described above. Thus, in a pixel which receives light, like infrared light, in a wavelength band in which the absorption efficiency in the semiconductor substrate 11 is low, the light having passed through the semiconductor substrate 11 can be reflected by the metal wirings 31. In such a manner, utilizing the reflection by the metal wirings 31, in the APD sensor 10, the on-chip lenses 13 are arranged such that the light is locally concentrated on the metal wirings 31, resulting in that the light can be locally concentrated to enhance the absorption efficiency.

<Second Configuration Example of APD Sensor>

Figure 2:
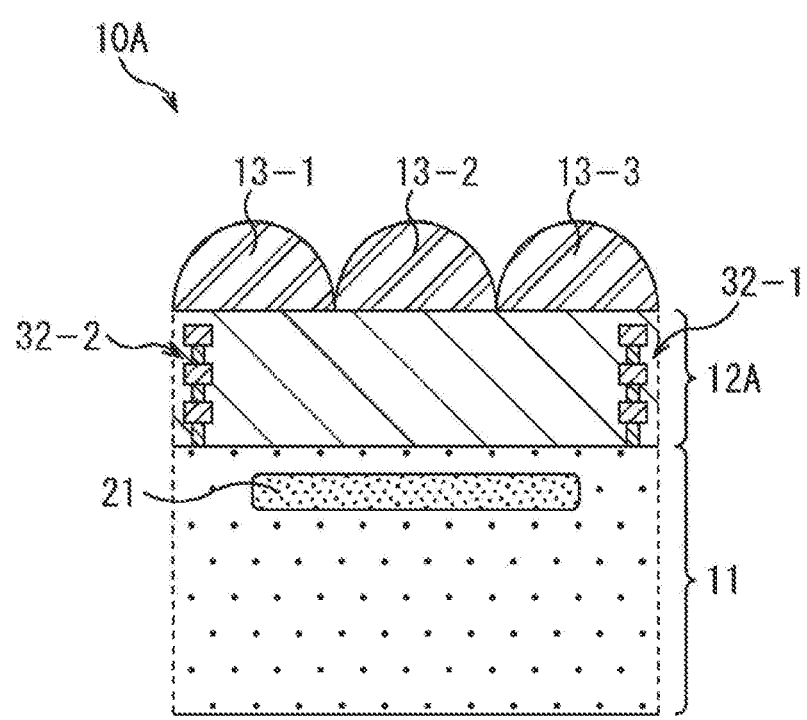
FIG. 2 is a view depicting a configuration example of an APD sensor according to a second embodiment.

FIG. 2 depicts a configuration example of the APD sensor 10 according to a second embodiment. It should be noted that in an APD sensor 10A depicted in FIG. 2, constituent elements same as those of the APD sensor 10 depicted in FIGS. 1A and 1B are assigned the same reference signs, and a detailed description thereof is omitted here.

As depicted in FIG. 2, the APD sensor 10A is different in configuration from the APD sensor 10 of FIGS. 1A and 1B in that a wiring layer 12A is laminated on a front surface of the semiconductor substrate 11 and a plurality of on-chip lenses 13 is laminated on the wiring layer 12A. In addition, in the wiring layer 12A, multilayer wirings 32-1 and 32-2 each of which is obtained by laminating a plurality of layers of wirings are formed in the vicinities of outer peripheries of the wiring layer 12A.

That is, the APD sensor 10 of FIGS. 1A and 1B are of the back-illuminated type as described above, whereas the APD sensor 10A is configured in the form of a front-illuminated type APD sensor in which the front surface side of the semiconductor substrate 11 is illuminated with light. In addition, in the APD sensor 10A, the avalanche multiplication region 21 is formed at a position in the vicinity of the wiring layer 12A on the front surface side in the semiconductor substrate 11.

In such a manner, also in the front-illuminated type APD sensor 10A, the configuration is adopted in which a plurality of on-chip lenses 13 is provided for one pixel region, resulting in that similarly to the case of the APD sensor 10 depicted in FIGS. 1A and 1B, the carriers generated through the photoelectric conversion can be efficiently used, and thus the enhancement of the light receiving sensitivity can be promoted.

<Third Configuration Example of APD Sensor>

Figure 3A:
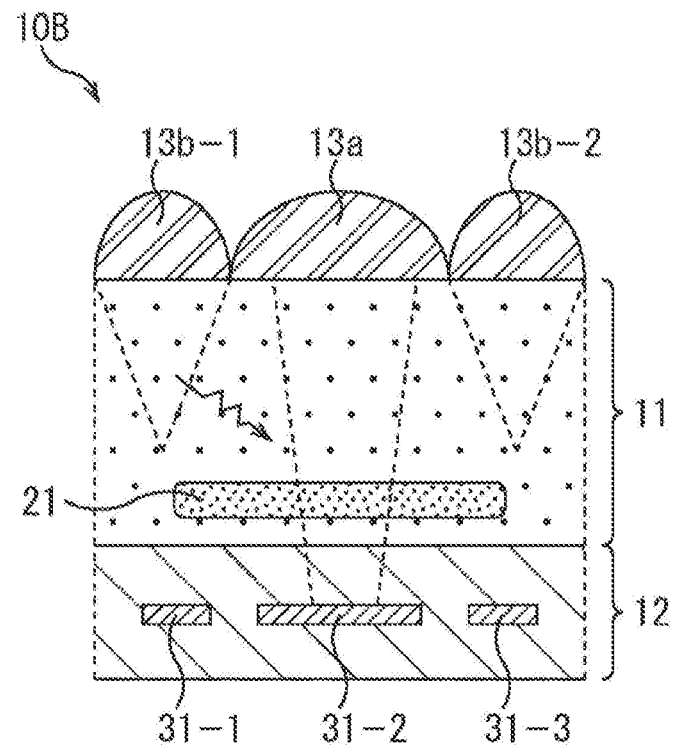
FIGS. 3A, 3B, and 3C are views depicting a configuration example of an APD sensor according to a third embodiment.
Figure 3B:
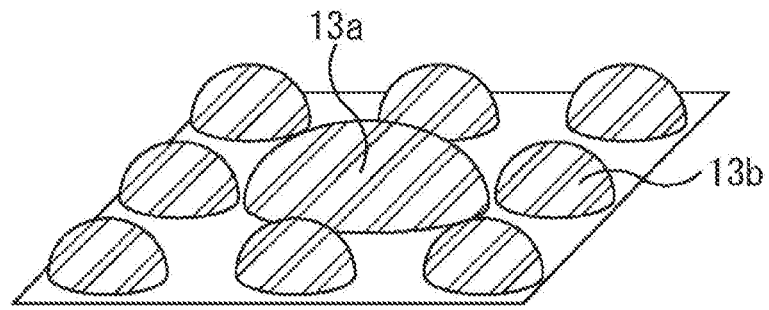
Figure 3C:
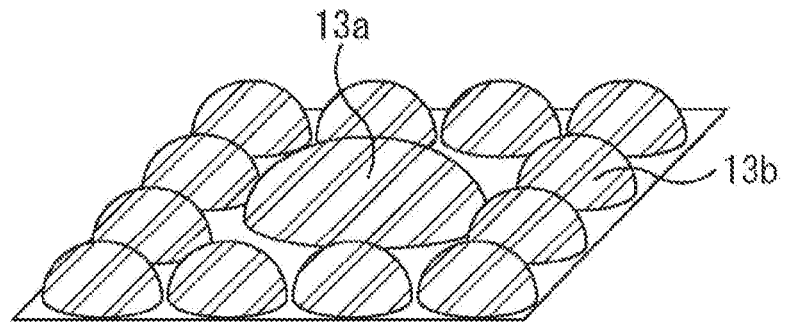

FIGS. 3A, 3B, and 3C depict a configuration example of the APD sensor 10 according to a third embodiment. It should be noted that in an APD sensor 10B depicted in FIGS. 3A, 3B, and 3C, constituent elements same as those of the APD sensor 10 depicted in FIGS. 1A and 1B are assigned the same reference signs, and a detailed description thereof is omitted here.

The APD sensor 10B of FIGS. 3A, 3B, and 3C are different in configuration from the APD sensor 10 of FIGS. 1A and 1B in that a plurality of on-chip lenses 13 having different sizes is laminated on the semiconductor substrate 11. For example, it is preferable to adopt a configuration in which as depicted in FIGS. 3A, 3B, and 3C, an on-chip lens 13a having a larger shape is arranged at a central portion of one pixel region of the APD sensor 10B, and on-chip lenses 13b each having a smaller shape are arranged in a peripheral portion of the one pixel region of the APD sensor 10B.

For example, each of the on-chip lenses 13b having the smaller shape can be formed in such a way that a curvature thereof is larger than that of the on-chip lens 13a. Therefore, the light made incident on the semiconductor substrate 11 via the on-chip lens 13b is condensed in an upper portion of the semiconductor substrate 11 to be photoelectrically converted. Then, since it is easy for the carriers which are generated through the photoelectric conversion in the upper portion of the semiconductor substrate 11 to flow into the avalanche multiplication region 21, the APD sensor 10B can multiply increased number of carriers.

In addition, the light which is made incident on the semiconductor substrate 11 via the on-chip lens 13a having the larger shape to pass through the semiconductor substrate 11 is reflected by the metal wiring 31-2 arranged at the center of the wiring layer 12 to be made incident on the semiconductor substrate 11 again. Then, the light which is made incident on the semiconductor substrate 11 again is photoelectrically converted in the vicinity of the avalanche multiplication region 21, and the resulting carriers flow into the avalanche multiplication region 21 to be multiplied.

In such a manner, in the APD sensor 10B, the plurality of on-chip lenses 13 having different sizes is suitably arranged, resulting in that the carriers generated through the photoelectric conversion can be used more efficiently and thus the enhancement of the light receiving sensitivity can be promoted.

In addition, FIGS. 3B and 3C depict examples of planar arrangement of the on-chip lens 13a and the on-chip lenses 13b.

For example, like a first arrangement example depicted in FIG. 3B, it is possible to adopt an arrangement in which one on-chip lens 13a is arranged at the center and eight on-chip lenses 13b are provided around the one on-chip lens 13a, achieving a 3×3 arrangement. Here, in the first arrangement example depicted in FIG. 3B, a gap is defined between adjacent ones of the on-chip lenses 13b having the small shape.

Then, like a second arrangement example depicted in FIG. 3C, it is more preferable to adopt an arrangement in which one on-chip lens 13a is arranged at the center and 12 on-chip lenses 13b are provided around the one on-chip lens 13a in such a way that no gap is defined between adjacent ones of the on-chip lenses 13b. In such a manner, with the configuration in which it is avoided to provide a gap between the on-chip lenses 13b, the APD sensor 10B can effectively utilize the incident light.

<Fourth Configuration Example of APD Sensor>

Figure 4:
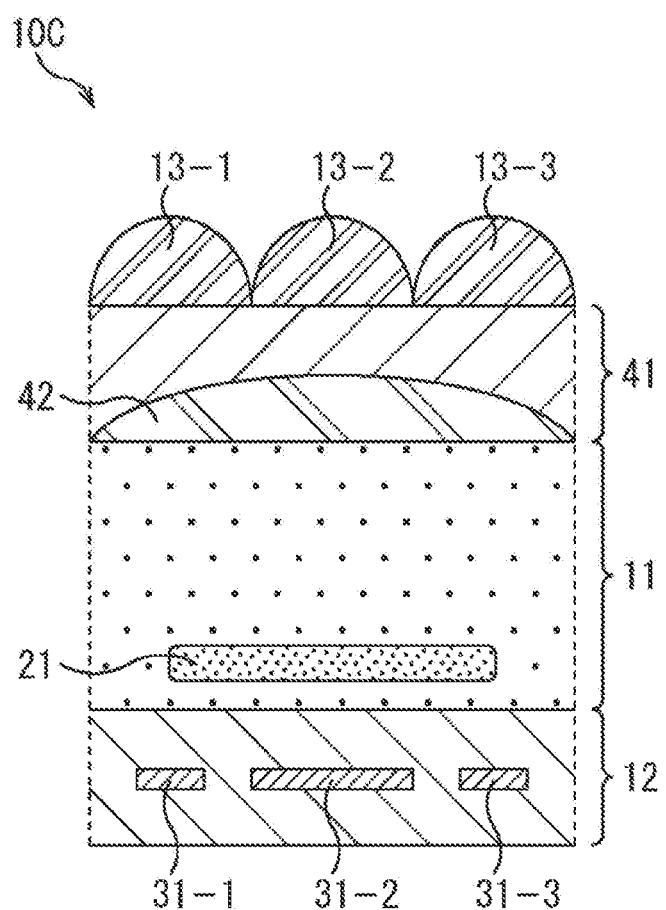
FIG. 4 is a view depicting a configuration example of an APD sensor according to a fourth embodiment.

FIG. 4 depicts a configuration example of the APD sensor 10 according to a fourth embodiment. It should be noted that in an APD sensor 10C depicted in FIG. 4, constituent elements same as those of the APD sensor 10 of FIGS. 1A and 1B are assigned the same reference signs, and a detailed description thereof is omitted here.

As depicted in FIG. 4, the APD sensor 10C is different in configuration from the APD sensor 10 of FIGS. 1A and 1B in that an inner lens layer 41 is laminated on the back surface of the semiconductor substrate 11, and a plurality of on-chip lenses 13 is laminated on the inner lens layer 41. In addition, in the inner lens layer 41, for example, one inner lens 42 is formed for one pixel region of the APD sensor 10C within a transparent resin layer, and the inner lens 42 further condenses the light condensed by the plurality of on-chip lenses 13 on the center of the one pixel region.

In such a manner, the APD sensor 10C adopts the configuration in which the inner lens 42 is arranged between the semiconductor substrate 11 and the plurality of on-chip lenses 13, resulting in that, for example, the condensed spot in the semiconductor substrate 11 can be made closer to the upper side (the side on which the light is made incident) as compared with the case of the APD sensor 10 of FIGS. 1A and 1B. As a result, since the optical path of the light made incident on the semiconductor substrate 11 can be further lengthened, the semiconductor substrate 11 can be further thinned. In a word, even if a thin semiconductor substrate 11 is used, it can be made hard for the light made incident on the semiconductor substrate 11 to pass therethrough. As a result, the APD sensor 10C can efficiently use the carriers generated through the photoelectric conversion, and thus the enhancement of the light receiving sensitivity can be promoted.

<Fifth Configuration Example of APD Sensor>

Figure 5:
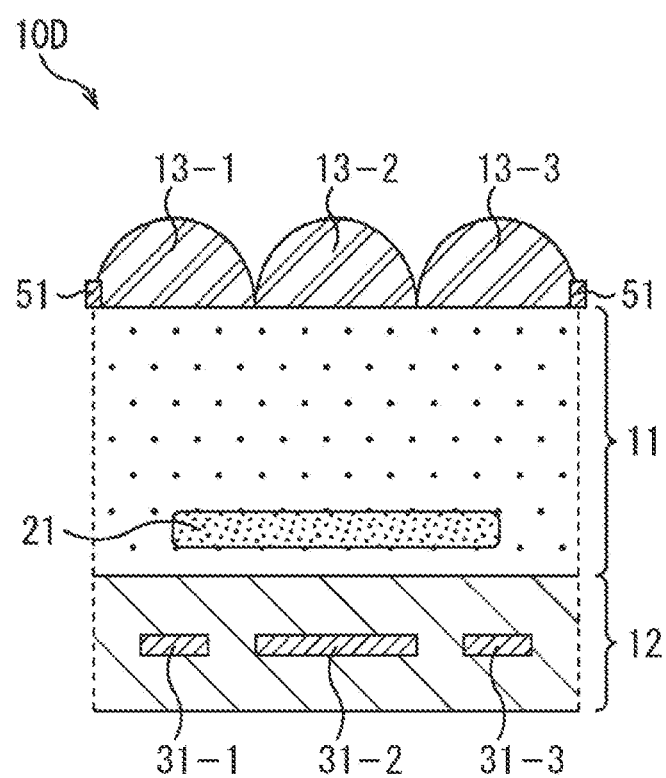
FIG. 5 is a view depicting a configuration example of an APD sensor according to a fifth embodiment.

FIG. 5 depicts a configuration example of the APD sensor 10 according to a fifth embodiment. It should be noted that in an APD sensor 10D depicted in FIG. 5, constituent elements same as those of the APD sensor 10 of FIGS. 1A and 1B are assigned the same reference signs, and a detailed description thereof is omitted here.

As depicted in FIG. 5, the APD sensor 10D is different in configuration from the APD sensor 10 of FIGS. 1A and 1B in that a light shielding film 51 having a light shielding property with which light is shielded is formed so as to surround a plurality of on-chip lenses 13, in one pixel region, laminated on the semiconductor substrate 11. That is, the APD sensor 10D is configured in such a way that in the light illumination surface of the semiconductor substrate 11, the light shielding film 51 shields adjacent pixel regions from each other.

In the APD sensor 10D configured in such a manner, the light shielding film 51 can prevent the light from mixedly entering adjacent other pixel regions in the light illumination surface of the semiconductor substrate 11. As a result, the APD sensor 10D can suppress occurrence of color mixture compared to the APD sensor 10 of FIGS. 1A and 1B.

<Sixth Configuration Example of APD Sensor>

Figure 6:
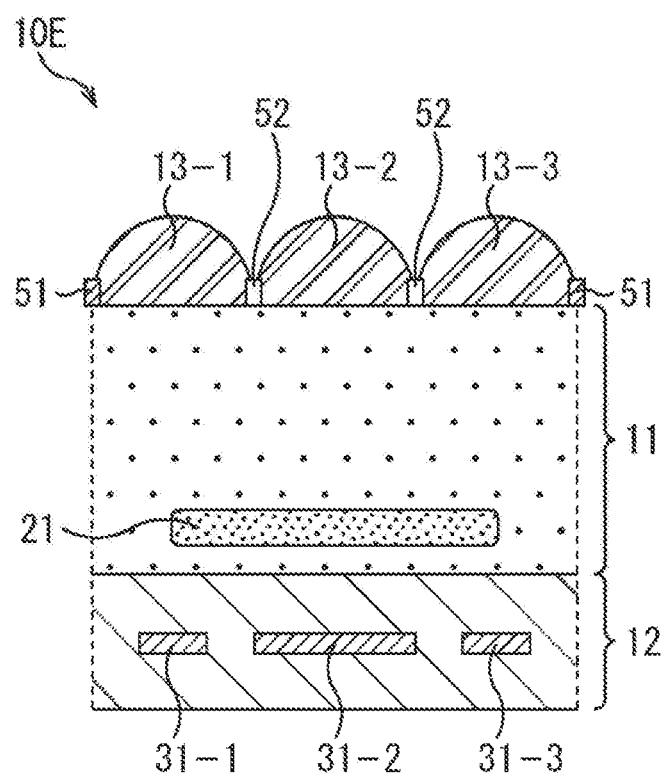
FIG. 6 is a view depicting a configuration example of an APD sensor according to a sixth embodiment.

FIG. 6 depicts a configuration example of the APD sensor 10 according to a sixth embodiment. It should be noted that in an APD sensor 10E depicted in FIG. 6, constituent elements same as those of the APD sensor 10 of FIGS. 1A and 1B are assigned the same reference signs, and a detailed description thereof is omitted here.

As depicted in FIG. 6, the APD sensor 10E is different in configuration from the APD sensor 10 of FIGS. 1A and 1B in that a light shielding film 51 is formed so as to surround a plurality of on-chip lenses 13, in one pixel region, laminated on the semiconductor substrate 11, and an inter-lens partition 52 is formed between adjacent ones of the on-chip lenses 13. That is, the APD sensor 10E, similarly to the APD sensor 10D of FIG. 5, includes the light shielding film 51. In addition thereto, the APD sensor 10E is configured in such a way that the plurality of on-chip lenses 13 in one pixel region is separated from each other by the inter-lens partition 52. In addition, the inter-lens partition 52 preferably includes a material having transmitting property with which light is transmitted. This can avoid reduction in amount of light received by the semiconductor substrate 11 which reduction may possibly be caused by the inter-lens partition 52.

In the APD sensor 10E configured in such a manner, the inter-lens partition 52 separates the on-chip lenses 13 from each other, resulting in that when the plurality of on-chip lenses 13 is formed, the uniformity of the on-chip lenses 13 can be increased. In a word, in the APD sensor 10E, the plurality of on-chip lenses 13 can be formed in a more uniform shape.

<Seventh Configuration Example of APD Sensor>

Figure 7:
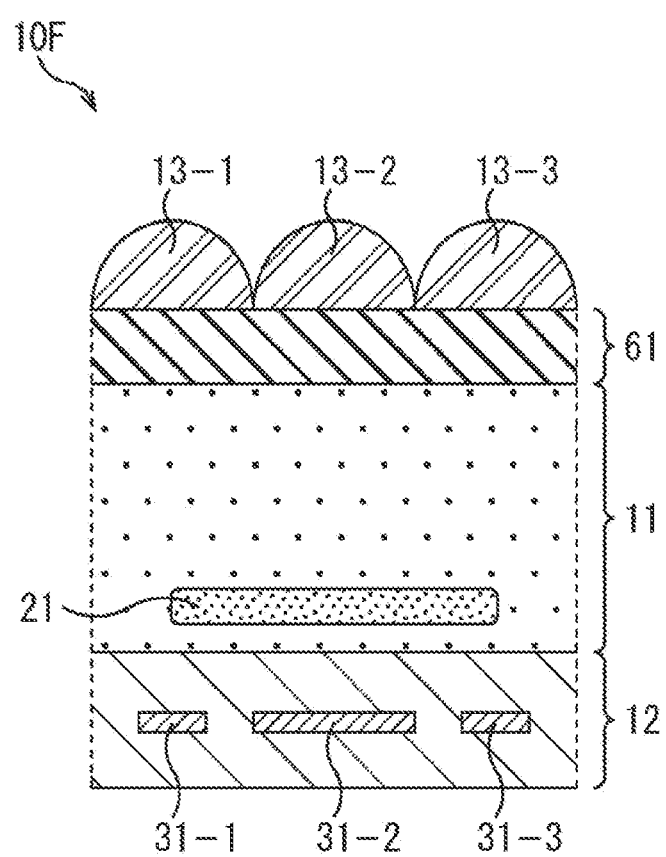
FIG. 7 is a view depicting a configuration example of an APD sensor according to a seventh embodiment.

FIG. 7 depicts a configuration example of the APD sensor 10 according to a seventh embodiment. It should be noted that in an APD sensor 10F depicted in FIG. 7, constituent elements same as those of the APD sensor 10 of FIGS. 1A and 1B are assigned the same reference signs, and a detailed description thereof is omitted here.

As depicted in FIG. 7, the APD sensor 10F is different in configuration from the APD sensor 10 of FIGS. 1A and 1B in that a band-pass filter 61 is laminated on the surface of the semiconductor substrate 11, and a plurality of on-chip lenses 13 is laminated on the band-pass filter 61. In addition, the band-pass filter 61 is a filter which allows only light in a predetermined wavelength range to pass therethrough. For example, a color filter (RGB filter) in the case of a visible light, a filter allowing only specific infrared light to pass therethrough, or the like is used as the band-pass filter 61.

In such a manner, the APD sensor 10F adopts the configuration in which the band-pass filter 61 is arranged between the semiconductor substrate 11 and the plurality of on-chip lenses 13, resulting in that, for example, a reaction of an APD in a specific wavelength range can be detected.

<Eighth Configuration Example of APD Sensor>

Figure 8:
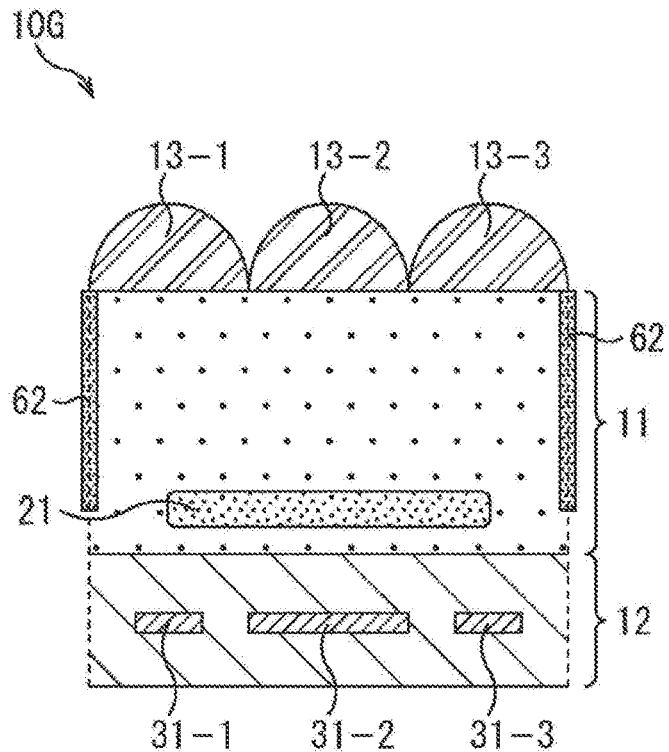
FIG. 8 is a view depicting a configuration example of an APD sensor according to an eighth embodiment.

FIG. 8 depicts a configuration example of the APD sensor 10 according to an eighth embodiment. It should be noted that in an APD sensor 10G depicted in FIG. 8, constituent elements same as those of the APD sensor 10 of FIGS. 1A and 1B are assigned the same reference signs, and a detailed description thereof is omitted here.

As depicted in FIG. 8, the APD sensor 10G is different in configuration from the APD sensor 10 of FIGS. 1A and 1B in that an insulating film 62 is embedded in a DTI (Deep Trench Isolation) formed so as to surround one pixel region of the semiconductor substrate 11. That is, in the APD sensor 10G, a deep trench is processed so as to separate adjacent pixel regions in the semiconductor substrate 11 from each other to form a DTI. Then, for example, a silicon nitride having a high insulating property is embedded in the DTI, thereby forming the insulating film 62.

In the APD sensor 10G configured in such a manner, the insulating film 62 separates the pixel regions from each other inside the semiconductor substrate 11, resulting in that the carriers generated through the photoelectric conversion in the semiconductor substrate 11 can be prevented from mixedly entering the adjacent pixel region. As a result, the APD sensor 10G can suppress occurrence of color mixture within the semiconductor substrate 11 compared to the APD sensor 10 of FIGS. 1A and 1B.

<Ninth Configuration Example of APD Sensor>

Figure 9:
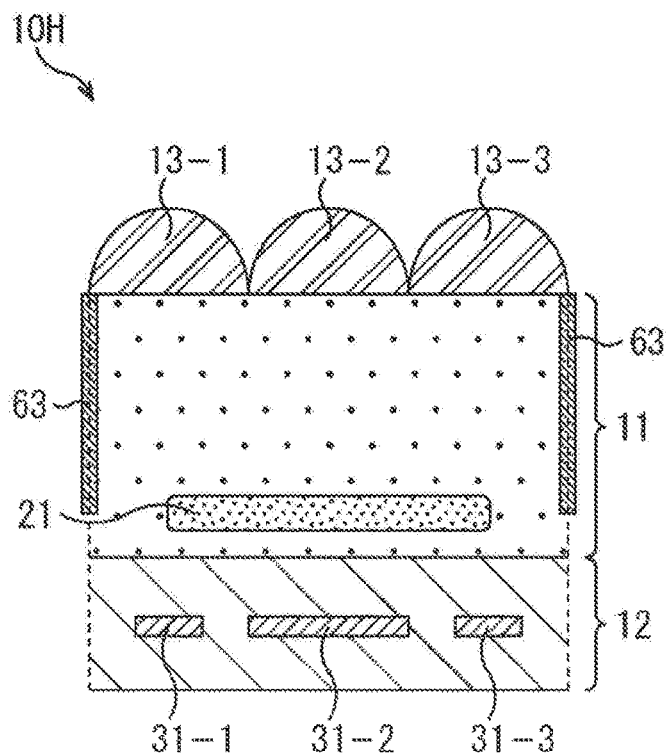
FIG. 9 is a view depicting a configuration example of an APD sensor according to a ninth embodiment.

FIG. 9 depicts a configuration example of the APD sensor 10 according to a ninth embodiment. It should be noted that in an APD sensor 10H depicted in FIG. 9, constituent elements same as those of the APD sensor 10 of FIGS. 1A and 1B are assigned the same reference signs, and a detailed description thereof is omitted here.

As depicted in FIG. 9, the APD sensor 10H is different in configuration from the APD sensor 10 of FIGS. 1A and 1B in that a metal film 63 having a light shielding property is embedded in a DTI formed so as to surround one pixel region of the semiconductor substrate 11. That is, in the APD sensor 10H, a deep trench is processed so as to separate adjacent pixel regions in the semiconductor substrate 11 from each other to form a DTI. Then, for example, a metal such as tungsten is embedded in the DTI so as to be insulated from the semiconductor substrate 11, thereby forming the metal film 63.

In the APD sensor 10H configured in such a manner, the metal film 63 separates the pixel regions from each other inside the semiconductor substrate 11, resulting in that the light made incident on the semiconductor substrate 11 can be prevented from mixedly entering the adjacent pixel region. As a result, the APD sensor 10H can suppress occurrence of color mixture within the semiconductor substrate 11 compared to the APD sensor 10 of FIGS. 1A and 1B. Moreover, when internal light emission occurs in the semiconductor substrate 11, the APD sensor 10H can prevent the generated light from mixedly entering the adjacent pixel region to suppress occurrence of color mixture.

Since the APD sensor 10 of each of the embodiments as described above enables the carriers generated through the photoelectric conversion to easily flow into the avalanche multiplication region 21, the number of carriers which are multiplied in the avalanche multiplication region 21 can be increased. In such a manner, the carriers can be efficiently used and, as a result, in the APD sensor 10, the enhancement of the light receiving sensitivity can be promoted.

In addition, in the APD sensor 10, as described above, the optical path inside the semiconductor substrate 11 can be lengthened, resulting in that the thinning of the semiconductor substrate 11 can be promoted, and the timing jitter can be suppressed. Further, the freedom of the design of the avalanche multiplication region 21 in the APD sensor 10 can be enhanced. In addition, in the case of the back-illuminated type APD sensor 10, also by reflecting the light having passed through the semiconductor substrate 11 by the metal wirings 31, increased amount of light can be photoelectrically converted.

Incidentally, although in each of the embodiments described above, the description has been given with respect to the configuration in which one avalanche multiplication region 21 is provided for one pixel region, for example, it is only necessary that the configuration is adopted in which at least one or more avalanche multiplication regions 21 are provided for one pixel region. That is, the number of avalanche multiplication regions 21 arranged for one pixel region can also be suitably selected such that the carriers can be efficiently used similarly to the case of the on-chip lenses 13. Then, these avalanche multiplication regions 21 can be suitably arranged in one pixel region. It should be noted that one pixel region in the APD sensor 10 means a unit region in which a sensor element used as one sensor output is arranged. In addition, the arrangement position of the avalanche multiplication region 21 depicted in each of the embodiments is merely an example, and it is by no means limited to the configurations described above.

It should be noted that the APD sensor 10 as described above can be used as an imaging element. For example, the APD sensor 10 can be applied to various kinds of electronic apparatuses such as an imaging system such as a digital still camera or a digital video camera, a mobile phone having an imaging function, or other apparatuses having an imaging function.

<Configuration Example of Imaging Device>

Figure 10:
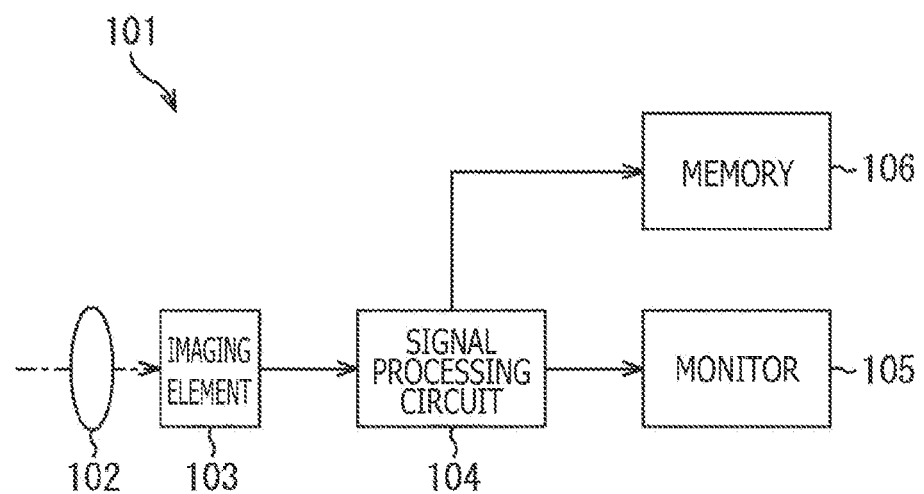
FIG. 10 is a block diagram depicting a configuration example of an imaging device.

FIG. 10 is a block diagram depicting a configuration example of an imaging device mounted to an electronic apparatus.

As depicted in FIG. 10, an imaging device 101 includes an optical system 102, an imaging element 103, a signal processing circuit 104, a monitor 105, and a memory 106, and can capture a still image and a moving image.

The optical system 102 includes one or a plurality of lenses, and guides image light (incident light) from a subject to the imaging element 103 to form an image on a light receiving surface (sensor section) of the imaging element 103.

The APD sensor 10 described above is applied as the imaging element 103. Electrons are accumulated in the imaging element 103 for a given period of time in accordance with the image formed on the light receiving surface via the optical system 102. Then, a signal according to the electrons accumulated in the imaging element 103 is supplied to the signal processing circuit 104.

The signal processing circuit 104 executes various kinds of signal processing for a pixel signal outputted from the imaging element 103. An image (image data) obtained by the signal processing circuit 104 executing the signal processing is supplied to the monitor 105 to be displayed, or supplied to the memory 106 to be stored (recorded).

The APD sensor 10 described above is applied in the imaging device 101 configured in such a manner, resulting in that, for example, an image having a higher sensitivity can be captured.

<Use Example of Image Sensor>

Figure 11:
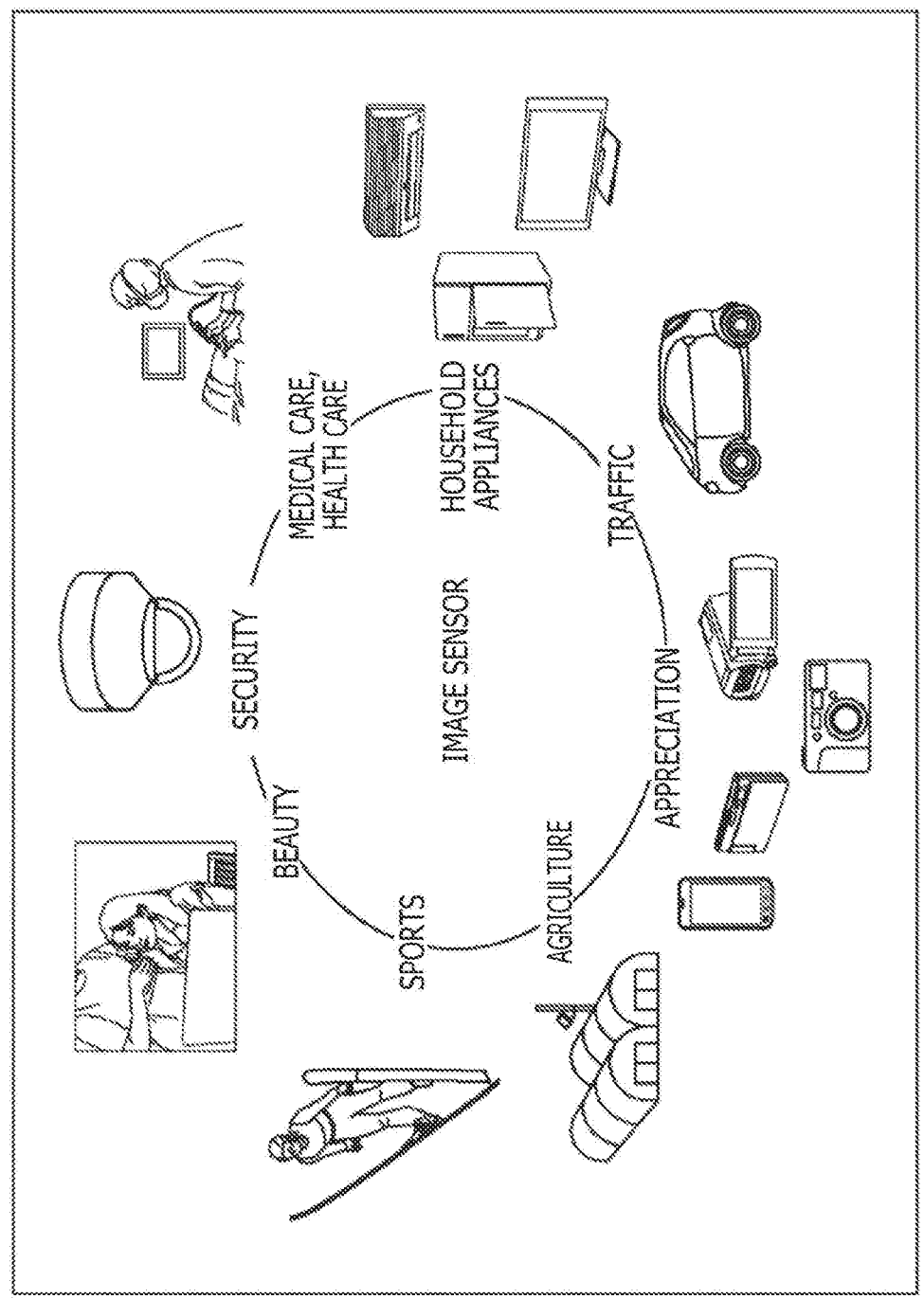
FIG. 11 is a view depicting examples of use in each of which an image sensor is used.

FIG. 11 is a view depicting a use example in which the image sensor described above is used.

The image sensor described above, for example, as will be described below, can be used in various cases in which light such as visible light, infrared light, ultraviolet rays, and X-rays is sensed.

A device for capturing an image for use in appreciation such as a digital camera or a portable apparatus with a camera function A device for use in traffic such as an on-board sensor for imaging the front or back, surroundings, inside or the like of an automobile for safe driving such as automatic stop, recognition of the state of the driver, or the like, a monitoring camera for monitoring a travelling vehicle or the road, or a distance measuring sensor for measuring a distance between vehicles or the like A device for use with household appliances such as a TV, a refrigerator or an air conditioner for imaging a gesture of a user to perform an apparatus operation according to the gesture A device for use in medical care or health care such as an endoscope, or a device for performing angiography by reception of infrared light A device for use in security such as a surveillance camera for security applications, or a camera for person authentication applications A device for use in beauty such as a skin measuring instrument for imaging the skin, or a microscope for imaging the scalp A device for use in sport such as an action camera or a wearable camera for sport applications A device for use in agriculture such as a camera for monitoring the state of a field or crops <Application Example to Mobile Body>

The technology according to the present disclosure (present technology) can be applied to various products. For example, the technology according to the present disclosure may also be realized as a device mounted to any kind of mobile bodies such as an automobile, an electric automobile, a hybrid electric automobile, a motorcycle, a bicycle, a personal mobility, an airplane, a drone, a ship, or a robot.

Figure 12:
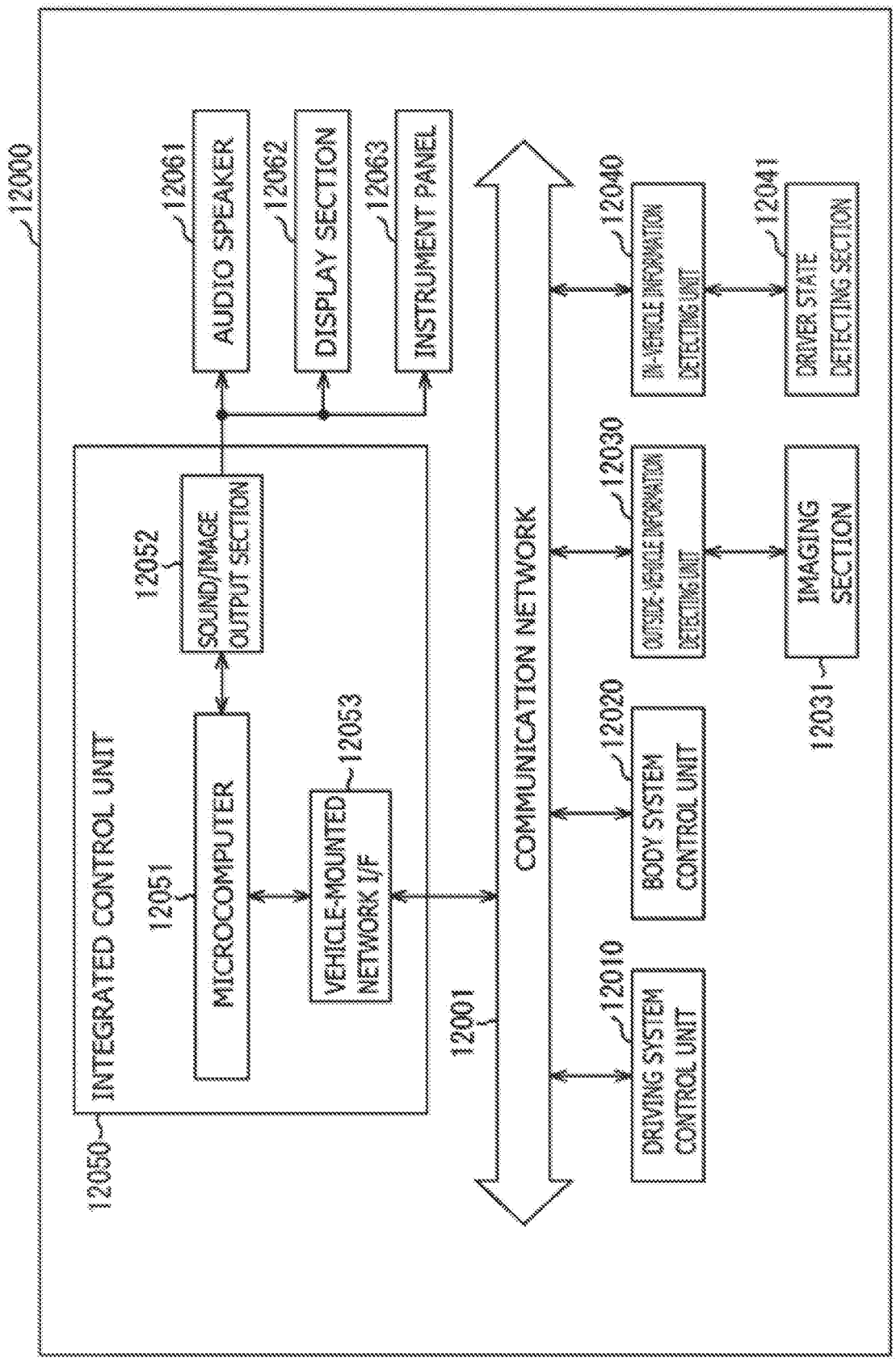
FIG. 12 is a block diagram depicting an example of schematic configuration of a vehicle control system.

FIG. 12 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 12, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 12, an audio speaker 12061, a display section 12062, and an instrument panel 12063 are illustrated as the output device. The display section 12062 may, for example, include at least one of an on-board display and a head-up display.

Figure 13:
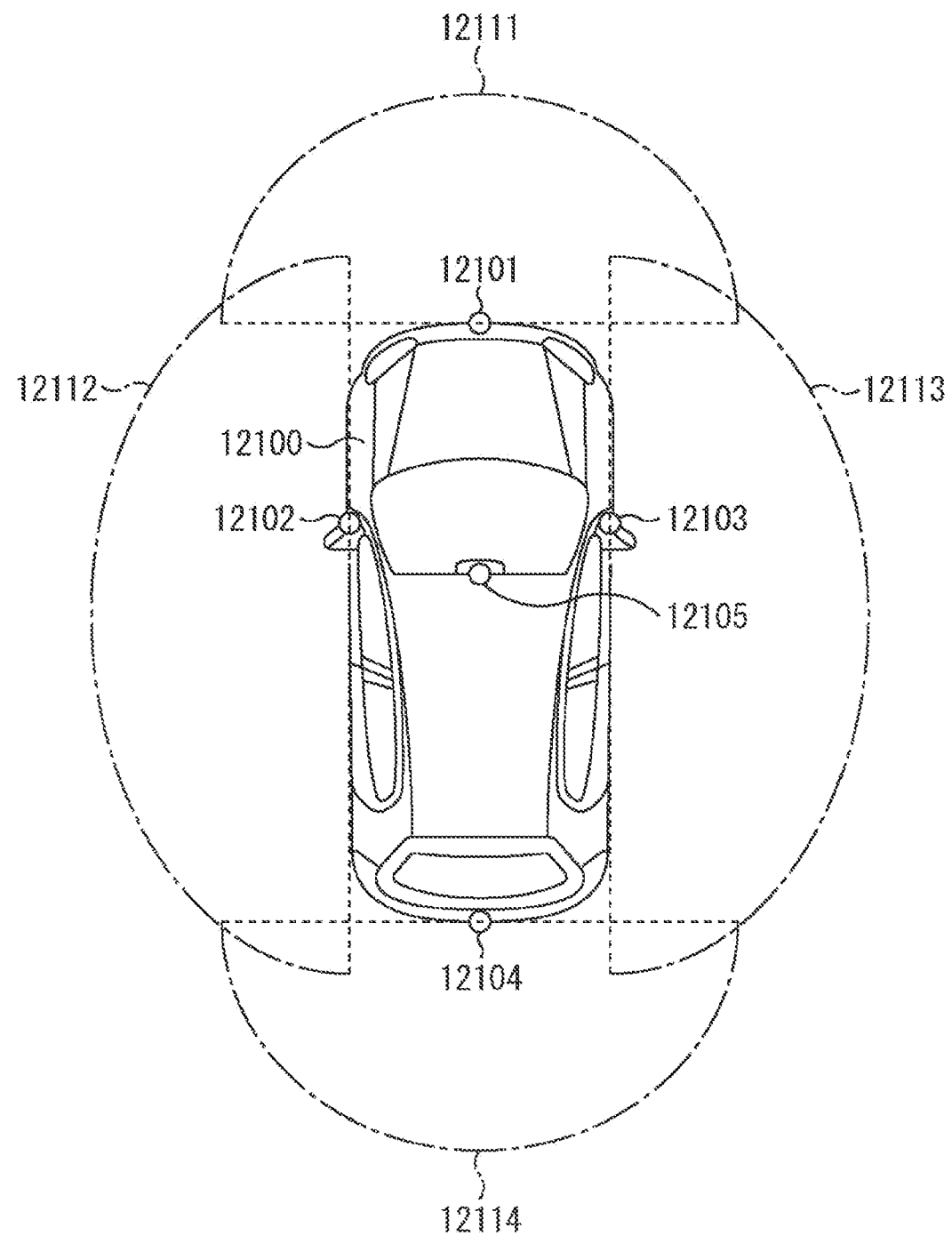
FIG. 13 is a diagram of assistance in explaining an example of installation positions of an outside-vehicle information detecting section and an imaging section.

FIG. 13 is a diagram depicting an example of the installation position of the imaging section 12031.

In FIG. 13, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 13 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure can be applied has been described so far. The technology according to the present disclosure, for example, can be applied to the imaging section 12031 among the constituent elements described so far. Specifically, the technology according to the present disclosure is applied to the imaging section 12031, resulting in that an image can be captured with a higher sensitivity.

<Example of Combinations of Constitutions>

It should be noted that the present technology can also adopt the following constitutions.

(1)

A sensor chip including:

a semiconductor substrate in which at least one or more avalanche multiplication regions multiplying carriers generated through photoelectric conversion are provided in each of a plurality of pixel regions; and an on-chip lens condensing light incident on the semiconductor substrate, in which a plurality of the on-chip lenses is arranged in one of the pixel regions.

(2)

The sensor chip according to (1) described above, further including:

a wiring layer laminated on a front surface side of the semiconductor substrate and including a wiring reflecting light, in which the sensor chip is of a back-illuminated type in which a back surface of the semiconductor substrate is illuminated with light.

(3)

The sensor chip according to (1) described above, further including:

a wiring layer laminated on a front surface side of the semiconductor substrate, in which the sensor chip is of a front-illuminated type in which a front surface of the semiconductor substrate is illuminated with light.

(4)

The sensor chip according to any one of (1) to (3) described above, in which silicon is used in the semiconductor substrate.

(5)

The sensor chip according to any one of (1) to (3) described above, in which a material suitable for detection of infrared light is used in the semiconductor substrate.

(6)

The sensor chip according to any one of (1) to (5) described above, in which when the semiconductor substrate is viewed in plan, a plurality of the on-chip lenses is arranged in such a way that the number of on-chip lenses arranged in a longitudinal direction and the number of on-chip lenses arranged in a transverse direction are equal to each other.

(7)

The sensor chip according to any one of (1) to (6) described above, in which a plurality of the on-chip lenses is each formed in a uniform size.

(8)

The sensor chip according to any one of (1) to (6) described above, in which a plurality of the on-chip lenses is formed in different sizes, and when the semiconductor substrate is viewed in plan, the on-chip lens arranged at a central portion is formed in larger size than those of the on-chip lenses arranged in a peripheral portion.

(9)

The sensor chip according to (8) described above, in which the on-chip lenses arranged in the peripheral portion are arranged in such a way that no gap is provided between each two of the on-chip lenses.

(10)

The sensor chip according to any one of (1) to (9) described above, further including:

an inner lens arranged between the semiconductor substrate and a plurality of the on-chip lenses and condensing light condensed by a plurality of the on-chip lenses on a center of the pixel region.

(11)

The sensor chip according to any one of (1) to (10) described above, further including:

a band-pass filter arranged between the semiconductor substrate and a plurality of the on-chip lenses and allowing only light in a predetermined wavelength range to pass therethrough.

(12)

The sensor chip according to any one of (1) to (11) described above, further including:

a light shielding film formed so as to surround a plurality of the on-chip lenses arranged in one of the pixel regions in a light illumination surface of the semiconductor substrate.

(13)

The sensor chip according to any one of (1) to (12) described above, further including:

an inter-lens partition formed so as to separate a plurality of the on-chip lenses from each other in a light illumination surface of the semiconductor substrate.

(14)

The sensor chip according to any one of (1) to (12) described above, further including:

an insulating film embedded in a trench which is formed so as to surround one of the pixel regions in the semiconductor substrate.

(15)

The sensor chip according to any one of (1) to (12) described above, further including:

a metal film embedded in a trench which is formed so as to surround one of the pixel regions in the semiconductor substrate.

(16)

An electronic apparatus including:

a sensor chip having a semiconductor substrate in which at least one or more avalanche multiplication regions multiplying carriers generated through photoelectric conversion are provided in each of a plurality of pixel regions, and an on-chip lens condensing light incident on the semiconductor substrate, a plurality of the on-chip lenses being arranged in one of the pixel regions.

It should be noted that the embodiments are by no means limited to the embodiments described above, and various changes can be made without departing from the subject matter of the present invention.

REFERENCE SIGNS LIST

10 APD sensor, 11 Semiconductor substrate, 12 Wiring layer, 13 On-chip lens, 21 Avalanche multiplication region, 31 Metal wiring, 32 Multilayer wiring, 41 Inner lens layer, 42 Inner lens, 51 Light shielding film, 52 Inter-lens partition, 61 Band-pass filter, 62 Insulating film, 63 Metal film

What is claimed is:

1. A light detecting device, comprising: a plurality of pixel regions, wherein a pixel region of the plurality of pixel regions includes:

a semiconductor substrate that includes a photoelectric conversion region;

a lens array including a plurality of lenses on a first surface side of the semiconductor substrate, wherein the plurality of lenses includes a first lens, a plurality of second lenses, and a plurality of third lenses, the plurality of second lenses is in a first row of the lens array, the first lens is in a second row of the lens array, the plurality of third lenses is in a third row of the lens array, in a plan view of the light detecting device, the first lens is sandwiched between the first row of the lens array and the third row of the lens array, and a size of the first lens is larger than a size of each of the plurality of second lenses in the first row and a size of each of the plurality of third lenses in the third row;

and a wiring layer on a second surface side of the semiconductor substrate opposite to the first surface side.

2. The light detecting device according to claim 1, wherein the semiconductor substrate comprises silicon.

3. The light detecting device according to claim 1, wherein the semiconductor substrate is configured to detect infrared light.

4. The light detecting device according to claim 1, wherein
in a case where the light detecting device is viewed in the plan view, the first lens is at a central portion of the pixel region, and
the plurality of second lenses and the plurality of third lenses are in a peripheral portion of the pixel region.

5. The light detecting device according to claim 1, wherein no gap is present between adjacent lenses of the plurality of second lenses.

6. The light detecting device according to claim 1, wherein a specific gap is present between adjacent lenses of the plurality of second lenses.

7. The light detecting device according to claim 1, wherein each of the first lens, each of the plurality of second lenses, and each of the plurality of third lenses is configured to condense light incident on the semiconductor substrate.

8. The light detecting device according to claim 1, wherein the semiconductor substrate further includes an avalanche multiplication region configured to multiply carriers generated through photoelectric conversion of light incident on the photoelectric conversion region of the semiconductor substrate.

9. The light detecting device according to claim 1, wherein
the wiring layer comprises a plurality of light-reflecting wirings including a first light-reflecting wiring, a second light-reflecting wiring, and a third light-reflecting wiring,
the second light-reflecting wiring is at a position that corresponds to the first lens, and
the second light-reflecting wiring has a wider area than each of the first light-reflecting wiring and the third light-reflecting wiring.

10. The light detecting device according to claim 9, wherein
the first light-reflecting wiring is at a position that corresponds to a second lens of the plurality of second lenses, and
the third light-reflecting wiring is at a position that corresponds to a third lens of the plurality of second lenses.

11. The light detecting device according to claim 1, wherein in a case where the light detecting device is viewed in the plan view, a number of lenses of the plurality of lenses in a longitudinal direction is equal to a number of lenses of the plurality of lenses in a transverse direction.

12. The light detecting device according to claim 1, wherein the light detecting device is of a back-illuminated type in which a back surface of the semiconductor substrate is illuminated with light.

13. A light detecting device, comprising: a plurality of pixel regions, wherein a pixel region of the plurality of pixel regions includes:
a semiconductor substrate that includes a photoelectric conversion region; and
a lens array including a plurality of lenses on a first surface side of the semiconductor substrate, wherein
the plurality of lenses includes a first lens, a plurality of second lenses, and a plurality of third lenses, the plurality of second lenses is in a first row of the lens array, the first lens is in a second row of the lens array, the plurality of third lenses is in a third row of the lens array,
in a plan view of the light detecting device, the first lens sandwiched between the first row of the lens array and the third row of the lens array, and a size of the first lens is larger than a size of each of the plurality of second lenses in the first row and a size of each of the plurality of third lenses in the third row.

14. The light detecting device according to claim 13, wherein
in a case where the light detecting device is viewed in the plan view, the first lens is at a central portion of the pixel region, and
the plurality of second lenses and the plurality of third lenses are in a peripheral portion of the pixel region.

15. The light detecting device according to claim 13, wherein each of the first lens, each of the plurality of second lenses, and each of the plurality of third lenses is configured to condense light incident on the semiconductor substrate.

16. The light detecting device according to claim 13, wherein the semiconductor substrate further includes an avalanche multiplication region configured to multiply carriers generated through photoelectric conversion of light incident on the photoelectric conversion region of the semiconductor substrate.

17. The light detecting device according to claim 13, further comprising a wiring layer on a second surface side of the semiconductor substrate opposite to the first surface side, wherein
the wiring layer comprises a plurality of light-reflecting wirings including a first light-reflecting wiring, a second light-reflecting wiring, and a third light-reflecting wiring,
the second light-reflecting wiring is at a position that corresponds to the first lens, and
the second light-reflecting wiring has a wider area than each of the first light-reflecting wiring and the third light-reflecting wiring.

18. The light detecting device according to claim 17, wherein
the first light-reflecting wiring is at a position that corresponds to a second lens of the plurality of second lenses, and
the third light-reflecting wiring is at a position that corresponds to a third lens of the plurality of second lenses.

19. The light detecting device according to claim 13, wherein the light detecting device is of a back-illuminated type in which a back surface of the semiconductor substrate is illuminated with light.

20. A light detecting device, comprising:
a photoelectric conversion region in a semiconductor substrate;
a lens array including a plurality of lenses on a first surface side of the semiconductor substrate, wherein
the plurality of lenses includes a first lens, a plurality of second lenses, and a plurality of third lenses,
the plurality of second lenses is in a first row of the lens array, the first lens is in a second row of the lens array, the plurality of third lenses is in a third row of the lens array,
in a plan view of the light detecting device, the first lens is sandwiched between the first row of the lens array and the third row of the lens array, and a size of the first lens is larger than a size of each of the plurality of second lenses in the first row and a size of each of the plurality of third lenses in the third row; and a wiring layer on a second surface side of the semiconductor substrate opposite to the first surface side.

* * * * *